US008217822B2

(12) United States Patent
Lovitt

(10) Patent No.: US 8,217,822 B2
(45) Date of Patent: Jul. 10, 2012

(54) RESOLUTION ENHANCING ANALOG-TO-DIGITAL CONVERSION

(75) Inventor: Andrew Lovitt, Redmond, WA (US)

(73) Assignee: Microsoft Corporation, Remond, WA (US)

( * ) Notice: Subject to any disclaimer, the term of this patent is extended or adjusted under 35 U.S.C. 154(b) by 99 days.

(21) Appl. No.: 12/942,821

(22) Filed: Nov. 9, 2010

(65) Prior Publication Data

US 2012/0112946 A1    May 10, 2012

(51) Int. Cl.
*H03M 1/12* (2006.01)
(52) U.S. Cl. ........................................ 341/155; 341/139
(58) Field of Classification Search .................. 341/139, 341/155, 159
See application file for complete search history.

(56) References Cited

U.S. PATENT DOCUMENTS

| | | | |
|---|---|---|---|
| 5,714,956 A * | 2/1998 | Jahne et al. | 341/155 |
| 5,777,569 A * | 7/1998 | Naruki et al. | 341/155 |
| 6,317,065 B1 * | 11/2001 | Raleigh et al. | 341/139 |
| 7,003,126 B2 | 2/2006 | Killion et al. | |
| 7,027,607 B2 | 4/2006 | Pedersen et al. | |
| 7,236,118 B2 | 6/2007 | Kurose et al. | |
| 7,365,664 B2 | 4/2008 | Caduff et al. | |
| 7,646,324 B2 | 1/2010 | Matsubayashi | |
| 7,944,383 B2 * | 5/2011 | Doris | 341/139 |
| 8,130,126 B2 * | 3/2012 | Breitschadel et al. | 341/139 |

OTHER PUBLICATIONS

Qaisar, et al., "Effective Resolution of an Adaptive Rate ADC", Retrieved at << http://hal.archives-ouvertes.fr/docs/00/45/18/47/PDF/Sampta09_SS08_117.pdf >>, May 2009, pp. 4.
Wnorowski, James J., "Increasing A/D Conversion Resolution by Dynamic Scale Adjustment", Retrieved at << http://via.mit.edu/documents/JWnorowski.pdf >>, Sep. 2008, pp. 1-37.
Green, Steve, "Increasing ADC Dynamic Range with Channel Summation ADC", Retrieved at << http://www.cirrus.com/en/pubs/apPNote/AN331REV1.pdf >>, Aug. 2008, pp. 1-8.
Neu, et al., "Multiple A/Ds versus a single one: pushing high-speed A/D converter SNR beyond the state of the art", Retrieved at << http://www.eetimes.com/design/automotive-design/4009960/Multiple-A-Ds-versus-a-single-one-pushing-high-speed-A-D-converter-SNR-beyond-the-state-of-the-art >>, Jul. 4, 2007, pp. 4.
Nandakumar, S., "High resolution floating point ADC", Retrieved at << http://www.ee.iitb.ac.in/~esgroup/es_mtech04_sem/es_sem04_paper_04307416.pdf >>, Nov. 2004, pp. 1-20.

* cited by examiner

*Primary Examiner* — Khai M Nguyen
(74) *Attorney, Agent, or Firm* — Alleman Hall McCoy Russell & Tuttle LLP

(57) ABSTRACT

A resolution-enhancing analog-to-digital signal conversion circuit is provided. The circuit includes a plurality of analog-to-digital converters arranged in parallel. Each analog-to-digital converter of the plurality of analog-to-digital converters is configured to output a digital signal that identifies an analog signal input to that analog-to-digital converter. The circuit further includes an input regulation module configured to clip the analog signal input to any of the plurality of analog-to-digital converters to within the voltage range corresponding to that analog-to-digital converter if such an analog signal otherwise is outside of the voltage range. The circuit further includes a controller configured to receive the digital signal output from each analog-to-digital converter and output an encoded signal based on one or more such digital signal that is received from an unclipped analog-to-digital converter having a highest analog-to-digital conversion resolution.

20 Claims, 4 Drawing Sheets

RESOLUTION ENHANCING ANALOG-TO-DIGITAL CONVERSION

BACKGROUND

An analog signal may be passed to an analog-to-digital (A/D) converter to digitally encode the analog signal. However, due to the large variance in dynamic range of some analog signals, the conversion voltage range of the A/D converter may not match the dynamic range of the analog signal and/or provide a high enough analog-to-digital conversion resolution. Furthermore, the analog signal may be modified in an expected time-varying manner due to hardware and/or environmental conditions. However, due to the time-varying difference of the analog signal modification, a static component implemented in the A/D converter to adjust the analog signal to fit the dynamic range may not account for the time-varying analog signal modification.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A resolution-enhancing analog-to-digital signal conversion circuit in accordance with embodiments of the present disclosure includes a plurality of analog-to-digital converters arranged in parallel. Each analog-to-digital converter of the plurality of analog-to-digital converters is configured to output a digital signal that identifies an analog signal input to that analog-to-digital converter. The resolution-enhancing analog-to-digital signal conversion circuit further comprises an input regulation module configured to clip the analog signal input to any of the plurality of analog-to-digital converters to an analog signal within the voltage range corresponding to that analog-to-digital converter if such an analog signal otherwise is outside of the voltage range corresponding to that analog-to-digital converter. The resolution-enhancing analog-to-digital signal conversion circuit further comprises a controller configured to receive the digital signal output from each of the plurality of analog-to-digital converters and output an encoded signal based on one or more such digital signal that is received from an unclipped one of the plurality of analog-to-digital converters having a highest analog-to-digital conversion resolution.

DETAILED DESCRIPTION

The present disclosure is directed to analog-to-digital (A/D) signal conversion. More particularly, the present disclosure is directed to an A/D signal conversion circuit that digitizes an analog signal input across a dynamic range with enhanced resolution. The disclosed A/D signal conversion circuit may limit quantization noise of the digital signal output.

Figure 1:
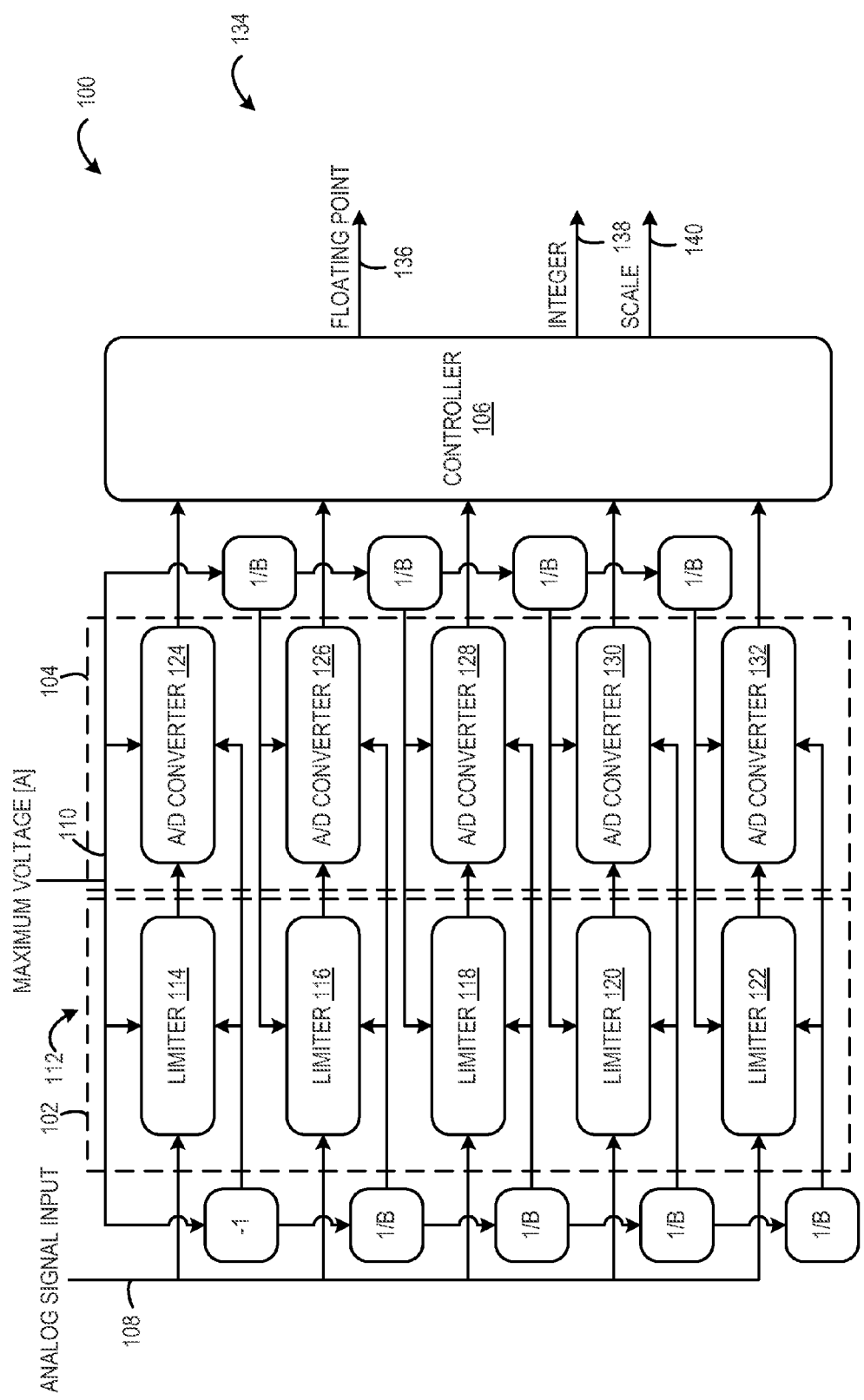
FIG. 1 schematically shows an embodiment of a resolution-enhancing analog-to-digital signal conversion circuit of the present disclosure.

FIG. 1 schematically shows an embodiment of a resolution-enhancing A/D signal conversion circuit 100 of the present disclosure. The resolution-enhancing A/D signal conversion circuit 100 may be configured to convert an analog signal of any type, including audio signals (e.g., speech), light signals (e.g., infrared light), etc. In another example, the analog signal input may include analog output that is feedback to the resolution-enhancing A/D signal conversion circuit 100. The analog signal input may be captured by any type of analog signal capture device. For example, the analog signal capture device may include a microphone, a light capture device, an accelerometer, etc. The resolution-enhancing A/D signal conversion circuit 100 may comprise an input regulation module 102, a plurality of A/D converters 104, and a controller 106.

The input regulation module 102 may be configured to receive an analog signal input 108 within a dynamic range. In one example, the analog signal input 108 characterizes audio input, or more particularly, speech input. The analog audio input may be provided by an audio capture device, such as an input microphone. A maximum voltage 110 may be set according to a detectable range of the microphone. In other words, the maximum voltage may be selected to correspond to the hardware limitations of the input device that generates the analog signal input. It will be appreciated that the analog signal input 108 may represent any suitable type of time-varying quantity and may be provided by virtually any one or more suitable analog input sources.

The input regulation module 102 may be configured to define a plurality of different voltage ranges within the dynamic range. In the illustrated embodiment, the input regulation module 102 comprises a plurality of limiters 112. Each limiter of the plurality of limiters 112 electrically couples to a corresponding A/D converter of the plurality of A/D converters 104. Each limiter protects each corresponding A/D converter from becoming overly saturated by clipping the analog signal input 108 to within a corresponding voltage range that is defined by a local maximum voltage and a local minimum voltage, if the analog signal input 108 is greater than the local maximum voltage or less than the local minimum voltage. In particular, a limiter of the plurality of limiters 112 may clip the analog signal input by adjusting the voltage of the analog signal input to the local maximum voltage of the voltage range if the voltage is greater than the local maximum voltage, or by adjusting the voltage of the analog signal input to the local minimum voltage if the voltage is less than the local minimum voltage. Note one or more limiters of the plurality of limiters 112 may clip the analog signal input within a defined voltage range for that limiter without adjusting the analog signal input provided to the other limiters of the plurality of limiters 112. In one example, a voltage follower circuit may be implemented at the input of one or more limiters of the plurality of limiters 112 to prevent a limiter from changing the analog signal input provided to the other limiters of the plurality of limiters 112.

The voltage range of each limiter of the plurality of limiters 112 may be set to any suitable voltage range. The plurality of voltage ranges may be sized differently. For example, a first voltage range may be sized to match the dynamic range of the analog signal input, and other voltage ranges may be sized smaller to provide greater resolution at different regions of the analog signal input. In some embodiments, the plurality of voltage ranges may be centered or focused on different target voltages. In some embodiments, the plurality of voltage ranges may be centered about a same target voltage.

In the illustrated embodiment, since the resolution-enhancing A/D signal conversion circuit 100 may be configured to convert an analog signal input representative of audio or speech capture, the voltage ranges of the plurality of limiters 112 may be centered about a same target voltage of zero volts, which may represent steady state operation of a microphone with no audio input. Note the circuit 100 may be applicable to other analog signal input and the target voltage may represent steady state operation of virtually any analog sensor. In particular, each limiter of the plurality of limiters 112 may clip the analog signal input 108 to a different voltage range that is progressively smaller than the dynamic range characterized by the maximum voltage 110, and each different voltage range is centered about zero volts to provide increased signal conversion resolution about that target voltage.

For example, a first limiter 114 may be configured to clip the analog signal input 108 to a voltage range centered about zero volts that matches the dynamic range. In particular, the local maximum voltage of the first limiter 114 may be set at the maximum voltage 110 and a local minimum voltage of the first limiter 114 may be set to a voltage equivalent to the maximum voltage 110 multiplied by a factor of [−1]. Accordingly, the first limiter 114 has a voltage range of [A, −A] where A is the maximum voltage 110.

A second limiter 116 may be configured to clip the analog signal input 108 to a different voltage range centered about zero volts that is progressively smaller than the voltage range clipped by the first limiter 114. In particular, the local maximum voltage of the second limiter 116 may be set to a voltage equivalent to the local maximum voltage of the first limiter 114 multiplied by a factor of [1/B] where B is the number of measurement intervals of the corresponding A/D converter or where B provides a range where more resolution is desired. In some embodiments, the number of measurement intervals of the plurality of A/D converters 104 is measured in bits. A local minimum voltage of the second limiter 116 may be set to a voltage equivalent to the local minimum voltage of the first limiter 114 multiplied by a factor of [1/B]. Accordingly, the second limiter 116 has a voltage range of [A/B,−A/B].

A third limiter 118 may be configured to clip the analog signal input 108 to a different voltage range centered about zero volts that is progressively smaller than the second limiter 116. In particular, the local maximum voltage of the third limiter 118 may be set to a voltage equivalent to the local maximum voltage of the first second limiter 116 multiplied by a factor of [1/B]. A local minimum voltage of the third limiter 118 may be set to a voltage equivalent to the local minimum voltage of the second limiter 116 multiplied by a factor of [1/B]. Accordingly, the third limiter 118 has a voltage range of $[A/(B^2),-A/(B^2)]$.

A fourth limiter 120 may be configured to clip the analog signal input 108 to a different voltage range centered about zero volts that is progressively smaller than the third limiter 118. In particular, the local maximum voltage of the fourth limiter 120 may be set to a voltage equivalent to the local maximum voltage of the third limiter 118 multiplied by a factor of [1/B]. A local minimum voltage of the fourth limiter 120 may be set to a voltage equivalent to the local minimum voltage of the third limiter 118 multiplied by a factor of [1/B]. Accordingly, the fourth limiter 120 has a voltage range of $[A/(B^3),-A/(B^3)]$.

A fifth limiter 122 may be configured to clip the analog signal input 108 to a different voltage range centered about zero volts that is progressively smaller than the fourth limiter 120. In particular, the local maximum voltage of the fifth limiter 122 may be set a voltage equivalent to the local maximum voltage of the fourth limiter 120 multiplied by a factor of [1/B]. A local minimum voltage of the fifth limiter 122 may be set to a voltage equivalent to the local minimum voltage of the fourth limiter 120 multiplied by a factor of [1/B]. Accordingly, the fifth limiter 122 has a voltage range of $[A/(B^4),-A/(B^4)]$.

In the illustrated embodiment, the input regulation module 102 includes a plurality of limiters 112 each having a voltage range that includes a fixed local maximum voltage and a fixed local minimum voltage. In some embodiments, the input regulation module 102 may be configured instead to dynamically adjust the local maximum voltage and/or the local minimum voltage of one or more limiters and/or a corresponding voltage range of one or more of the plurality of A/D converters 104 based on an operating parameter. As one example, the operating parameter may include the voltage level of the analog signal input 108.

In some embodiments, the input regulation module 102 may not include any limiters. In some embodiments, the input regulation module 102 may be configured to set one or more voltage ranges of the plurality of A/D converters, in a fixed or dynamic manner, via software control or another suitable mechanism.

Continuing with FIG. 1, the resolution-enhancing A/D signal conversion circuit 100 comprises the plurality of A/D converters, which are arranged in parallel. Each A/D converter of the plurality of A/D converters 104 may be configured to output a digital signal that identifies an analog signal input to that A/D converter. In other words, each A/D converter of the plurality of A/D converters 104 outputs a digital signal representative of an analog signal input in a voltage range of that A/D converter. Furthermore, the digital signal output by each A/D converter has a resolution that may be based on the voltage range and the number of measurement intervals (e.g., bits, $2^{(number\ of\ bits)}$, etc.) of that A/D converter.

As discussed above, the first A/D converter 124 may be configured to convert an analog signal of a first voltage range. In one example, the first voltage range is the equivalent of the dynamic range (e.g., [A,−A]). Each other A/D converter (e.g., second A/D converter 126, third A/D converter 128, fourth A/D converter 130, fifth A/D converter 132) may be configured to convert an analog signal of a progressively smaller voltage range with a progressively higher A/D conversion resolution. In the illustrated embodiment, each voltage range is centered about zero volts and progressively decreases by a constant factor (e.g., [1/B]) from the dynamic range.

The resolution-enhancing A/D signal conversion circuit 100 comprises a controller 106 that may be configured to receive the digital signal output from each of the plurality of A/D converters 104, in parallel. The controller 106 may be configured to output an encoded signal 134 based on one such digital signal that is received from an unclipped one of the plurality of A/D converters 104 having a highest A/D conversion resolution. In other words, the controller 106 may be configured to select a digital signal from an A/D converter having a highest resolution that is within a voltage range and has not been set to the local maximum voltage or the local minimum voltage for that voltage range, and output an encoded signal 134 that identifies the analog input voltage of the selected A/D converter. Note the controller 106 may be configured to perform any suitable mathematical or logical operation on one or more of the plurality of digital signals output from the plurality of A/D converters 104 to output the encoded signal 134.

A block of example pseudo-code configuring the controller 106 to select the digital signal for floating point output from which the encoded signal 134 output by circuit 100 is based is provided:

```
float outputLevel = 0.0;
if (level5.value < level5.maxLevel−level5.tolerance
    || level5.value > level5.minLevel+level5.tolerance) {
        outputlevel = level5.value*level5.scale; // where scale relates
        local voltage levels to the maximum/minimum voltages for the A/D
        converter.
} else if (level4.value < level4.maxLevel−level4.tolerance
    || level4.value > level4.minLevel+level4.tolerance) {
        outputlevel = level4.value *level4.scale; // where scale relates
        local voltage levels to the maximum/minimum voltages for the A/D
        converter.
} else if (level3.value < levels.maxLevel−level3.tolerance
    || level3.value > level3.minLevel+level3.tolerance) {
        outputlevel = level3.value *level3.scale; // where scale relates
        local voltage levels to the maximum/minimum voltages for the A/D
        converter.
} if (level2.value < level2.maxLevel−level2.tolerance
    || level2.value > level2.minLevel+level2.tolerance) {
        outputlevel = level2.value *level2.scale; // where scale relates
        local voltage levels to the maximum/minimum voltages for the A/D
        converter.
} else { // Top level is the be resolution.
        outputlevel = level1.value *level1.scale; // where scale relates local
voltage levels to the maximum/minimum voltages for the A/D converter.
}
```

The pseudo-code starts with the digital signal output from the highest resolution A/D converter and checks to see if the digital signal is the equivalent to the local maximum voltage within a predetermined tolerance or the local minimum voltage within a predetermined tolerance for the voltage range of the A/D converter. If the digital signal is not equivalent to the local maximum voltage within the predetermined tolerance or the local minimum voltage within the predetermined tolerance for the voltage range of the A/D converter, then the digital signal is unclipped and the digital signal is selected, and the encoded signal 134 is based on that digital signal. For example, the selected digital signal may be multiplied by the scale of the voltage range for the A/D converter/limiter and the resulting product may be included in the encoded signal 134. If the digital signal is equivalent to the local maximum voltage within the predetermined tolerance or the local minimum voltage within the predetermined tolerance for the voltage range of the A/D converter, then the digital signal is clipped and the digital signal is not selected. Note in some implementations, the predetermined tolerance may be set on a per A/D converter-limiter pair basis since each A/D converter may have different noise and/or voltage rail characteristics. On the other hand, in some implementations, the predetermined tolerance may be the same for some or all of the A/D converter-limiter pairs. The pseudo-code moves to the next highest resolution A/D converter, and so on, searching for an unclipped digital signal, until an unclipped digital signal is found. Since searching starts at the highest resolution digital signal and moves to the lowest resolution digital signal, the first unclipped signal that is found is the highest resolution unclipped signal.

For example, using the example described above with reference to FIG. 1, if A=1, B=4, and each of the plurality of A/D converters are 16 bits, the following conditions apply:

| Level | Local Max Voltage | Local Min Voltage | Bits/Volt |
|---|---|---|---|
| $1^{st}$ | 1 | −1 | 8 |
| $2^{nd}$ | 0.25 | −0.25 | 32 |
| $3^{rd}$ | 0.0625 | −0.0625 | 128 |
| $4^{th}$ | 0.015625 | −0.015625 | 512 |
| $5^{th}$ | 0.003906 | −0.003906 | 2048 |

In view of the above conditions, in one example, if an analog signal input has a voltage of 0.5 volts, the $5^{th}$ limiter clips the analog signal to 0.003906 volts, the $4^{th}$ limiter clips the analog signal to 0.015625 volts, the $3^{rd}$ limiter clips the analog signal to 0.0625 volts, and the $2^{nd}$ limiter clips the analog signal to 0.25 volts, and the $1^{st}$ limiter outputs an unclipped 0.5 volt signal that is converted with an 8 bits/volt conversion resolution. In this example, the $1^{st}$ level is selected, because the other signals are clipped, and the $1^{st}$ limiter outputs an unclipped signal.

As another example, if an analog signal input has a voltage of 0.04 volts, the $5^{th}$ limiter clips the analog signal to 0.003906 volts, and the $4^{th}$ limiter clips the analog signal to 0.015625 volts. Further, the $3^{rd}$ limiter outputs an unclipped 0.04 volt signal that is converted with a 128 bits/volt conversion resolution, the $2^{rd}$ limiter outputs a 0.04 volt signal that is converted with a 32 bits/volt conversion resolution, and the $1^{st}$ limiter outputs a 0.04 volt signal that is converted with an 8 bits/volt conversion resolution. In this example, $3^{rd}$ level is selected, because the $4^{th}$ level and the $5^{th}$ level signals are clipped, and the $3^{rd}$ level operates with the highest resolution unclipped signal.

As yet another example, if an analog signal input has a voltage of 0.001 volts. None of the limiters clip the signal. In this example, the $5^{th}$ level is selected, because all of the signals are unclipped and the $5^{th}$ level operates with the highest resolution signal.

In some embodiments, the encoded signal may include a floating point number 136 indicating a voltage level of the digital signal that is received from the unclipped/selected A/D converter having the highest A/D conversion resolution.

In some embodiments, the encoded signal may include an integer value 138 and the controller 106 may be configured to output a multiplier value 140 that qualifies scaling of the integer value 138 to correspond to a voltage level of the digital signal that is received from the unclipped/selected A/D converter having the highest A/D conversion resolution.

In the embodiment described above with reference to FIG. 1, each A/D converter of the plurality of A/D converter has a same number of measurement intervals (e.g., bits). In some embodiments, one or more A/D converters of the plurality of A/D converters may instead have a different number of measurement intervals (e.g., bits). Furthermore, in the illustrated embodiment, the voltage range of each limiter decreases in size by a constant factor (e.g., [1/B]) from the voltage range of the first limiter. In some embodiments, the voltage range of one or more limiters and/or a corresponding voltage range of one or more of the plurality of A/D converters may instead decrease in size by a different or varying factor. Also, in the illustrated embodiment, the local voltage range of each level gets progressively smaller. In other embodiments, two or more levels may have local voltage ranges of the same size. Further still, in the illustrated embodiment, each of the local voltage ranges is centered on a common target voltage (i.e., 0 volts). In other embodiments, different local voltage ranges may be centered on different targets.

Figure 2:
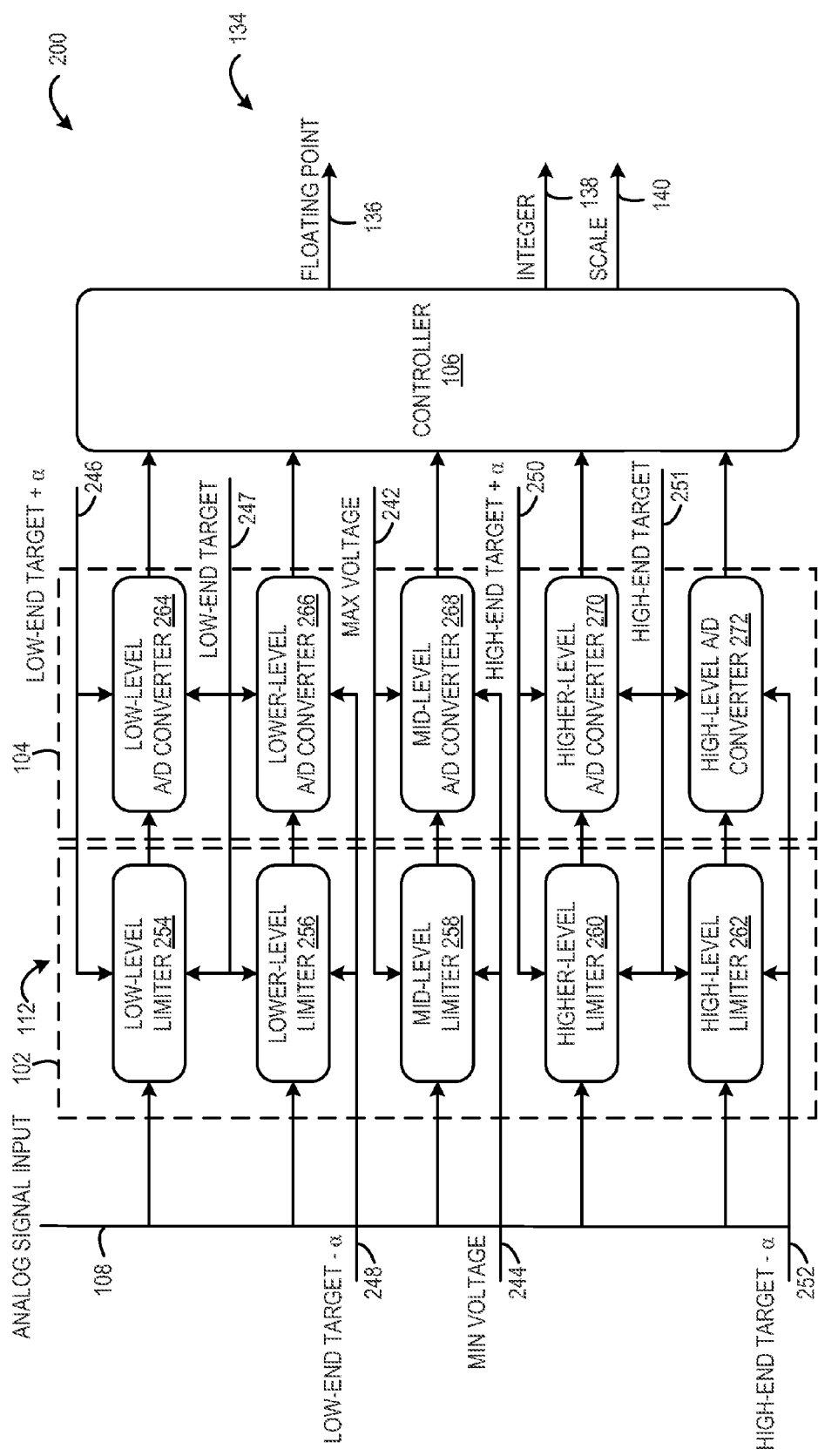
FIG. 2 schematically shows another embodiment of a resolution-enhancing analog-to-digital signal conversion circuit of the present disclosure.

FIG. 2 schematically shows another embodiment of a resolution-enhancing A/D signal conversion circuit 200 of the present disclosure. The resolution-enhancing A/D signal conversion circuit 200 may be configured to output digital signals with enhanced resolution about a plurality of target voltages within a dynamic range.

Components of resolution-enhancing A/D signal conversion circuit 200 that may be substantially the same as those of the resolution-enhancing A/D signal conversion circuit 100 are identified in the same way and are described no further. However, it will be noted that components identified in the same way in different embodiments of the present disclosure may be at least partly different.

In the illustrated embodiment, the resolution-enhancing A/D signal conversion circuit 200 may be configured to convert an analog signal input 108 that drifts about target voltages ±1. In one example, the resolution-enhancing A/D signal conversion circuit 200 may be implemented in a detector/digitizer in order to enhance the resolution of the signal conversion about the poles (i.e., +1 and −1 in FIG. 2). In this example, the circuit 200 may monitor the output of the detector/digitizer, in contrast to the circuit 100 that may monitor analog signal input from an external sensor. As such, some of the plurality of A/D converters 104 may be configured to have smaller voltage ranges and greater resolution about the target voltage of one volt and negative one volt.

For example, a mid-level A/D converter 268 may be configured to convert a voltage in a voltage range that matches a dynamic range of the analog signal input 108. In other words, the mid-level A/D converter 268 may be configured to convert an analog signal of the dynamic range of the resolution-enhancing A/D signal conversion circuit 200. In particular, a local maximum voltage of the mid-level A/D converter 268 may be set to a maximum voltage 242 and a local minimum voltage of the mid-level A/D converter 268 may be set to a minimum voltage 244. In one example, where conversion circuit 200 is included in a bang-bang controller with poles at ±1, the maximum voltage may be 1.5 volts and the minimum voltage may be −1.5 volts. In some embodiments, the local maximum voltage and the local minimum voltage of the mid-level A/D converter 268 may be set by a corresponding mid-level limiter 258 of the input regulation module 102.

A high-level A/D converter 272 may be configured to have a voltage range that is different than the voltage range of the mid-level A/D converter 268. The voltage range of the high-level A/D converter 272 may be bound by a local maximum voltage that may be set to a high-end target voltage 251. A local minimum voltage of the high-level A/D converter 272 may be set to a voltage 252 that may be equivalent to a difference of the high-end target voltage (e.g., 1) and a tolerance value ($\alpha$). Since the high-level A/D converter 272 has a smaller voltage range than the mid-level A/D converter 268, the high-level A/D converter 272 may have a higher A/D conversion resolution than the mid-level A/D converter 268, even when both converters have the same number of bits. In some embodiments, the input signal to the high-level A/D converter 272 may be clipped by a corresponding high-level limiter 262 of the input regulation module 102.

A higher-level A/D converter 270 may be configured to have a voltage range that is different than the voltage range of the mid-level A/D converter 268. The voltage range of the higher-level A/D converter 270 may be bound by a local maximum voltage that may be set to a voltage 250 that may be equivalent to a sum of the high-end target voltage and the tolerance value. A local minimum voltage of the higher-level A/D converter 270 may be set to the high-end target voltage 251. Since the higher-level A/D converter 270 has a smaller voltage range than the mid-level A/D converter 268, the higher-level A/D converter 270 may have a higher A/D conversion resolution than the mid-level A/D converter 268. In some embodiments, the input signal to the higher-level A/D converter 270 may be clipped by a corresponding higher-level limiter 260 of the input regulation module 102. The voltage range of the higher-level A/D converter 270 focuses in a region just above the high-end target voltage 251 and the high-level A/D converter 272 focuses in a region just below the high-end target voltage 251. Accordingly, analog signals near the high-end target voltage may be converted with higher precision.

A low-level A/D converter 264 may be configured to have a voltage range that is different than the voltage range of the mid-level A/D converter 268. The voltage range of the low-level A/D converter 264 may be bound by a local maximum voltage that may be set to a voltage 246 that may be equivalent to a sum of a low-end target voltage (e.g., −1) and a tolerance value ($\alpha$). A local minimum voltage of the low-level A/D converter 264 may be set to the low-end target voltage 247. Since the low-level A/D converter 264 has a smaller voltage range than the mid-level A/D converter 268, the low-level A/D converter 264 may have a higher A/D conversion resolution than the mid-level A/D converter 268. In some embodiments, the input signal to the low-level A/D converter 264 may be clipped by a corresponding low-level limiter 254 of the input regulation module 102.

A lower-level A/D converter 266 may be configured to have a voltage range that is different than the voltage range of the mid-level A/D converter 268. The voltage range of the lower-level A/D converter 266 may be bound by a local maximum voltage that may be set to the low-end target voltage 247. A local minimum voltage of the lower-level A/D converter 266 may be set to a voltage 248 that may be equivalent to a difference of the low-end target and the tolerance value. Since the lower-level A/D converter 266 has a smaller voltage range than the mid-level A/D converter 268, the lower-level A/D converter 266 may have a higher A/D conversion resolution than the mid-level A/D converter 268.

The voltage range of the lower-level A/D converter 270 focuses in a region just below the lower target voltage and the low-level A/D converter 272 focuses in a region just above the lower target voltage. Accordingly, analog signals near the lower target voltage may be converted with higher precision.

The embodiment of FIG. 2 is provided as a nonlimiting example, and other arrangements are within the scope of this disclosure. In particular, various levels of A/D converters may be used, and each level may have a desired voltage range and a desired voltage target. For example, in some embodiments, an A/D converter level may include a converter and a limiter that cooperate to convert analog signals centered about a high or low target voltage.

In some embodiments, the plurality of A/D converters 104 each has a same number of measurement intervals. In some embodiments, some of the A/D converter other than the mid-level A/D converter may have the same A/D conversion resolution. For example, the high-level A/D converter 272 and the low-level A/D converter 264 may have a same size A/D conversion resolution. In some embodiments, the voltage range of one or more of the plurality of limiters 112 may be set utilizing a constant factor. In this way, a voltage range may be made progressively smaller. It will be appreciated that virtually any suitable factor value may be utilized. Further, it will be appreciated that the tolerance value ($\alpha$) may be set to virtually any suitable value via any suitable circuitry.

The controller 106 may be configured to receive the digital signal output from each of the plurality of A/D converters 104 and output an encoded signal 134 based on one such digital signal that is received from an unclipped analog-to-digital converter having the highest analog-to-digital conversion resolution.

The resolution-enhancing A/D signal conversion circuit 200 includes additional A/D converters relative to conventional bang-bang circuits that utilize a single A/D converter. As such, resolution-enhancing A/D signal conversion circuit 200 may get more accurate conversion readings of the voltage levels around the poles (i.e., +1 and −1). Such a configuration allows for a more accurate sampling in the regions of interest of the analog signal input without dynamically tuning a gain of the circuit and thus losing sensing ability beyond the narrow ranges of interest.

Figure 3:
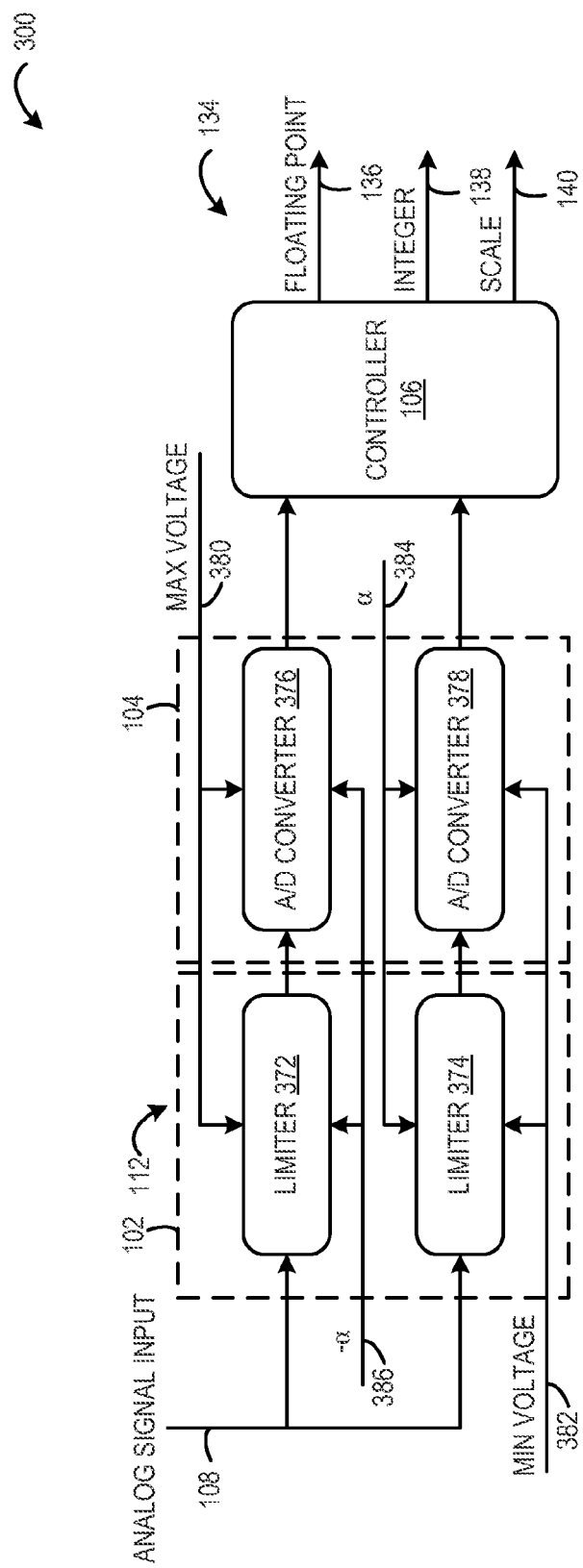
FIG. 3 schematically shows another embodiment of a resolution-enhancing analog-to-digital signal conversion circuit of the present disclosure.

FIG. 3 schematically shows another embodiment of a resolution-enhancing A/D signal conversion circuit 300 of the present disclosure. The resolution-enhancing A/D signal conversion circuit 300 may be configured to output digital signals with enhanced resolution about a target voltage by overlap sampling a region about the target voltage. In other words, a plurality of A/D converters may be tuned to different voltage ranges that overlap and include the target voltage. By providing additional voltage data around the target voltage via overlapping voltage ranges, resolution of the digitized voltage can be enhanced.

Components of resolution-enhancing A/D signal conversion circuit 300 that may be substantially the same as those of the resolution-enhancing A/D signal conversion circuit 100 are identified in the same way and are described no further. However, it will be noted that components identified in the same way in different embodiments of the present disclosure may be at least partly different.

In one example, the resolution-enhancing A/D signal conversion circuit 300 may be implemented in a system that may be slightly noisy or has poor estimations around a target voltage (e.g., zero) in order to enhance the resolution of the signal conversion about the target voltage. In particular, a plurality of A/D convertors may have overlapping voltage ranges that include the target voltage and a controller may be configured to combine and analyze the digital signals output by the plurality of A/D converters (e.g., through mathematical or logic operations) to estimate the output with enhanced resolution.

For example, the resolution-enhancing A/D signal conversion circuit 300 may be configured to convert an analog signal input 108 between a maximum voltage 380 and a minimum voltage 382. An A/D converter 376 may be configured to convert a voltage in an upper voltage range that includes the target voltage. In other words, a local maximum voltage of the A/D converter 376 may be set to the maximum voltage 380 and a local minimum voltage of the A/D converter 376 may be set to a voltage 386 that represents a tolerance (−α) below the target voltage that is greater than the minimum voltage 382. In some embodiments, the local maximum voltage and the local minimum voltage of the A/D converter 376 may be set by a corresponding upper limiter 372 of the input regulation module 102.

An A/D converter 378 may be configured to have a voltage range that is different than the voltage range of the A/D converter 376. The A/D converter 378 may be configured to convert a voltage in a lower voltage range that includes the target voltage. The lower voltage range of the A/D converter 378 may be bound by a local maximum voltage that may be set to a voltage 384 that represents a tolerance (α) above the target voltage that is less than the maximum voltage 380. A local minimum voltage of the A/D converter 378 may be set to the minimum voltage 382. In some embodiments, the input signal to the A/D converter 378 may be clipped by a corresponding limiter 374 of the input regulation module 102.

In this example, the circuit 300 may overlap sample the region around the target voltage bound by a selected tolerance (e.g., specifically [−α, α]) to improve the accuracy of the estimate of the voltage in the region.

A block of example pseudo-code configuring the controller 106 to select the digital signal for floating point output from which the encoded signal 134 output by circuit 300 is based is provided:

---

Float output; (levelX.value is the output after being scaled by the voltage range and offset due to the non-zero offset of the detection region.)
if (level1.value > α) { output = level1.value;
} else if (level2.value < −α) { output = level2.value;
} else { output = (level1.value+level2.value)/2;
}

---

The logic starts with the digital signal output from the A/D converter 376 and checks to see if the digital signal is in the upper voltage range (i.e., between the max voltage and −α) and not in the lower voltage range (i.e., greater than the tolerance (α) above the target voltage). If the digital signal is at a voltage greater than the tolerance (α) above the target voltage, the digital signal is selected and scaled appropriately based on the dynamic range of the A/D converter 376. If the digital signal is not greater than the tolerance (α) above the target voltage, the logic checks to see if the digital signal output by the A/D converter 378 is in the lower voltage range (i.e., between min voltage and α) and not in the upper voltage range (i.e., less than the tolerance (−α) below the target voltage). If the digital signal is at a voltage less than the tolerance (−α) below the target voltage, the digital signal is selected and scaled appropriately based on the dynamic range of the A/D converter 378. If the digital signal is not less than the tolerance (−α) below the target voltage, the output voltage may be set to an average of the output voltage of the A/D converter 376 and the output voltage of the A/D converter 378 since the digital voltage is in the upper voltage range and the lower voltage range.

For example, using the example described above with reference to FIG. 3, if MAX VOLTAGE=3, MIN VOLTAGE=−3, α=1, and −α=−1 and the target voltage is zero, in one example, if an analog signal input has a voltage of 2 volts, the A/D converter 376 outputs an unclipped voltage of 2 volts, the A/D converter 378 outputs a clipped voltage of 1 volt, and the controller 106 selects the digital signal at 2 volts output by the A/D converter 376 as because it is unclipped.

As another example, if an analog signal input has a voltage of −2 volts, the A/D converter 376 outputs a clipped voltage of −1 volts, the A/D converter 378 outputs an unclipped voltage of −2 volts, and the controller 106 selects the digital signal at −2 volts output by the A/D converter 378 because the digital signal is unclipped.

As another example, if an analog signal input has a voltage of 0.5 volts, the A/D converter 376 outputs an unclipped voltage of 0.5 volts, the A/D converter 378 outputs an unclipped voltage of 0.5 volts, and the controller 106 outputs a signal based on an average of the digital signal output of the two A/D converters, which is 0.5 volts, since both digital signals are unclipped. It should be noted that in practice the various unclipped A/D converters may have slightly different readings of the same signal, and thus an average taken from the plurality of unclipped signals may help mitigate errors.

Figure 4:
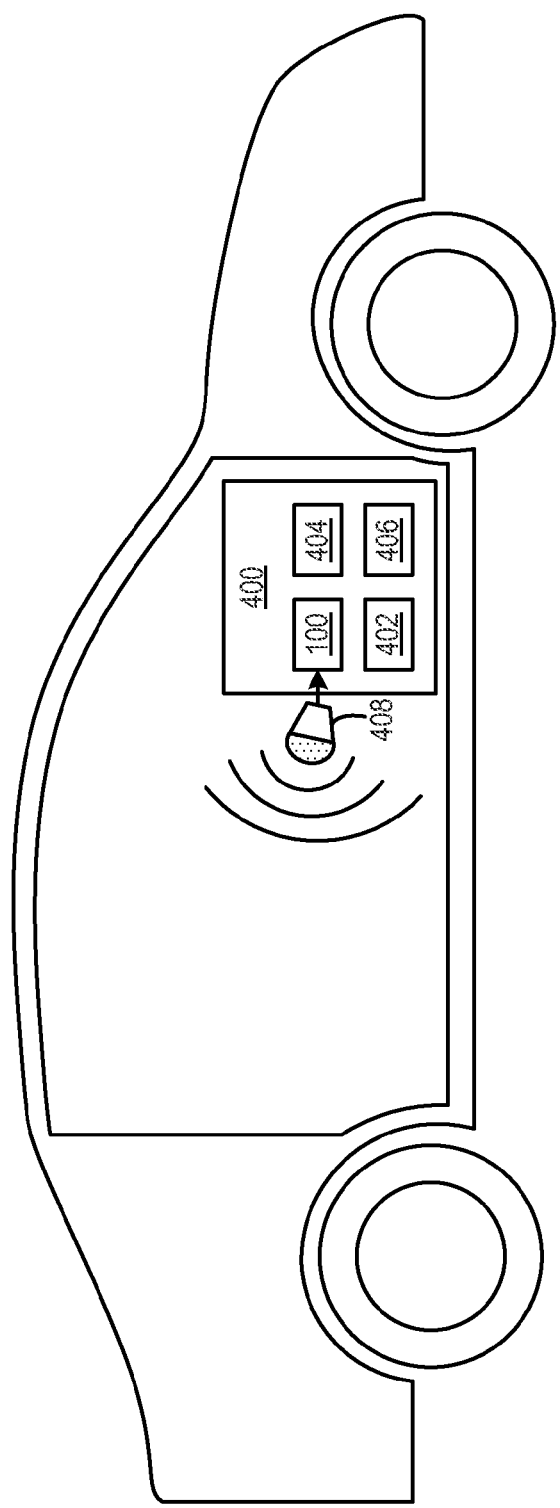
FIG. 4 schematically shows an embodiment of an audio capture system including a resolution-enhancing analog-to-digital signal conversion circuit implemented in an automotive environment.

FIG. 4 schematically shows an embodiment of an audio capture system 400 including the resolution-enhancing A/D signal conversion circuit 100 implemented in an automotive environment. The audio capture system 400 may include an audio detection device 408, such as a microphone to generate the analog signal input 108 (shown in FIG. 1) based on a detected sound pressure generated, for example, by speech input from an automobile driver and/or passenger. The audio detection device 408 may be positioned in a vehicle cabin to capture speech of a vehicle operator. The audio capture system 400 may be configured to generate control commands to control various automobile operations "hands free' based on the speech input.

The resolution-enhancing A/D signal conversion circuit 100 may comprise a plurality of A/D converters 104 arranged in parallel. Each A/D converter of the plurality of A/D converters 104 may be configured to output a digital signal that identifies the analog signal input to that analog-to-digital converter. A first A/D converter 124 (shown in FIG. 1) may be configured to convert an analog signal of a voltage range defined by a detectable voltage range of the audio detection device 408. In other words, the local maximum voltage and the local minimum voltage of the voltage range of the first A/D converter 124 may be set to the hardware voltage limit of the audio detection device 408. Each other A/D converter may be configured to convert an analog signal of a different, progressively smaller voltage range that is centered about a same target value zero volts. Each other A/D converter may have a progressively higher analog-to-digital conversion resolution than the first A/D converter.

An input regulation module 102 (shown in FIG. 1) may be configured to clip the analog signal input 108 to any of the plurality of A/D converters 104 to an analog signal within the voltage range corresponding to that A/D converter if such an analog signal otherwise is outside of the voltage range corresponding to that A/D converter.

A controller 106 (shown in FIG. 1) may be configured to receive the digital signal output from each of the plurality of A/D converters 104 and output an encoded signal 134 based on one such digital signal that is received from an unclipped analog-to-digital converter having a highest analog-to-digital conversion resolution.

The audio capture system 300 may generate control commands based on the encoded signal 134. The audio capture system 300 is shown in simplified form. It is to be understood that virtually any computer or electrical architecture may be used for the audio capture system 300 without departing from the scope of this disclosure.

The audio capture system 300 includes a logic subsystem 302 and a data-holding subsystem 304. The audio capture system 300 may optionally include a display subsystem 306 and/or other components not shown in FIG. 3. The audio capture system 300 may also optionally include user input devices such as keypads, dials, cameras, and/or touch screens, for example.

The logic subsystem 302 may include one or more physical devices configured to execute one or more instructions. For example, the logic subsystem may be configured to execute one or more instructions that are part of one or more applications, services, programs, routines, libraries, objects, components, data structures, or other logical constructs. Such instructions may be implemented to perform a task, implement a data type, transform the state of one or more devices, or otherwise arrive at a desired result.

The logic subsystem may include one or more processors that are configured to execute software instructions. Additionally or alternatively, the logic subsystem may include one or more hardware or firmware logic machines configured to execute hardware or firmware instructions. Processors of the logic subsystem may be single core or multicore, and the programs executed thereon may be configured for parallel or distributed processing. The logic subsystem may optionally include individual components that are distributed throughout two or more devices, which may be remotely located and/or configured for coordinated processing. One or more aspects of the logic subsystem may be virtualized and executed by remotely accessible networked computing devices configured in a cloud computing configuration.

The data-holding subsystem 304 may include one or more physical, non-transitory, devices configured to hold data and/or instructions executable by the logic subsystem to implement the herein described methods and processes. When such methods and processes are implemented, the state of the data-holding subsystem 304 may be transformed (e.g., to hold different data).

The data-holding subsystem 304 may include removable media and/or built-in devices. The data-holding subsystem 304 may include optical memory devices (e.g., CD, DVD, HD-DVD, Blu-Ray Disc, etc.), semiconductor memory devices (e.g., RAM, EPROM, EEPROM, etc.) and/or magnetic memory devices (e.g., hard disk drive, floppy disk drive, tape drive, MRAM, etc.), among others. The data-holding subsystem 304 may include devices with one or more of the following characteristics: volatile, nonvolatile, dynamic, static, read/write, read-only, random access, sequential access, location addressable, file addressable, and content addressable. In some embodiments, the logic subsystem 302 and data-holding subsystem 304 may be integrated into one or more common devices, such as an application specific integrated circuit or a system on a chip.

The terms "module," "program," and "engine" may be used to describe an aspect of the audio capture system 300 that is implemented to perform one or more particular functions. In some cases, such a module, program, or engine may be instantiated via logic subsystem 302 executing instructions held by data-holding subsystem 304. It is to be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" are meant to encompass individual or groups of executable files, data files, libraries, drivers, scripts, database records, etc.

When included, the display subsystem 306 may be used to present a visual representation of data held by data-holding subsystem 304. As the herein described systems and processes change the data held by the data-holding subsystem, and thus transform the state of the data-holding subsystem, the state of display subsystem 306 may likewise be transformed to visually represent changes in the underlying data. Display subsystem 306 may include one or more display devices utilizing virtually any type of technology. Such display devices may be combined with logic subsystem 302 and/or data-holding subsystem 304 in a shared enclosure, or such display devices may be peripheral display devices.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A resolution-enhancing analog-to-digital signal conversion circuit, comprising:
a plurality of analog-to-digital converters arranged in parallel, each analog-to-digital converter of the plurality of analog-to-digital converters being configured to output a digital signal that identifies an analog signal input to that analog-to-digital converter, one of the plurality of analog-to-digital converters being configured to convert an analog signal of a first voltage range, and each other analog-to-digital converter being configured to convert an analog signal of a progressively smaller voltage range with a progressively higher analog-to-digital conversion resolution;
an input regulation module configured to clip the analog signal input to any of the plurality of analog-to-digital converters to an analog signal within the voltage range corresponding to that analog-to-digital converter if such an analog signal otherwise is outside of the voltage range corresponding to that analog-to-digital converter; and
a controller configured to receive the digital signal output from each of the plurality of analog-to-digital converters and output an encoded signal based on one such digital signal that is received from an unclipped one of the plurality of analog-to-digital converters having a highest analog-to-digital conversion resolution.

2. The resolution-enhancing analog-to-digital signal conversion circuit of claim 1, where each of the plurality of analog-to-digital converters is configured to identify an analog signal of a different, progressively smaller, voltage range, and where each different voltage range is centered about a same target voltage.

3. The resolution-enhancing analog-to-digital signal conversion circuit of claim 1, wherein the controller is configured to output an encoded signal based on the one such digital signal and one or more other unclipped signals.

4. The resolution-enhancing analog-to-digital signal conversion circuit of claim 1, wherein the plurality of analog-to-digital converters each have a same number of measurement intervals.

5. The resolution-enhancing analog-to-digital signal conversion circuit of claim 1, wherein the input regulation module is configured to dynamically adjust a local maximum voltage and/or a local minimum voltage of a corresponding voltage range of one or more of the plurality of analog-to-digital converters based on an operating parameter.

6. The resolution-enhancing analog-to-digital signal conversion circuit of claim 1, wherein each voltage range includes a fixed local maximum voltage and a fixed local minimum voltage.

7. The resolution-enhancing analog-to-digital signal conversion circuit of claim 1, wherein each other voltage range decreases in size by a constant factor from the first voltage range.

8. The resolution-enhancing analog-to-digital signal conversion circuit of claim 1, wherein the encoded signal includes a floating point number indicating a voltage level of the digital signal that is received from the unclipped analog-to-digital converter having the highest analog-to-digital conversion resolution.

9. The resolution-enhancing analog-to-digital signal conversion circuit of claim 1, wherein the encoded signal includes an integer value and the controller is configured to output a second signal that includes a multiplier value that qualifies scaling of the integer value to correspond to a voltage level of the digital signal that is received from the unclipped analog-to-digital converter having the highest analog-to-digital conversion resolution.

10. The resolution-enhancing analog-to-digital signal conversion circuit of claim 1, wherein the input regulation module comprises a plurality of limiters, each limiter of the plurality of limiters being electrically coupled to a corresponding analog-to-digital converter and configured to clip the analog signal input to that analog-to-digital converter to an analog signal within the voltage range corresponding to that analog-to-digital converter if the analog signal otherwise is outside of the voltage range corresponding to that analog-to-digital converter.

11. The resolution-enhancing analog-to-digital signal conversion circuit of claim 1, wherein the first voltage range corresponds to a dynamic range of an audio detection device configured to generate the analog signal based on a detected sound pressure.

12. A resolution-enhancing analog-to-digital signal conversion circuit, comprising:
a plurality of analog-to-digital converters arranged in parallel, each analog-to-digital converter of the plurality of analog-to-digital converters being configured to output a digital signal that identifies an analog signal input to that analog-to-digital converter, the plurality of analog-to-digital converters including at least:
a mid-level analog-to-digital converter configured to convert an analog signal of a first voltage range bound by a high-end voltage and a low-end voltage,
a high-level analog-to-digital converter configured to convert an analog signal of a second voltage range, different than the first voltage range, including a high-end target voltage, the high-level analog-to-digital converter having a higher analog-to-digital conversion resolution than the mid-level analog-to-digital converter, and
a low-level analog-to-digital converter configured to convert an analog signal of a third voltage range, different than the first voltage range and the second voltage range, the third voltage range including a low-end target voltage, the low-level analog-to-digital converter having a higher analog-to-digital conversion resolution than the mid-level analog-to-digital converter;
an input regulation module configured to clip the analog signal input to any of the plurality of analog-to-digital converters to an analog signal within the voltage range corresponding to that analog-to-digital converter if such an analog signal otherwise is outside of the voltage range corresponding to that analog-to-digital converter; and
a controller configured to receive the digital signal output from each of the plurality of analog-to-digital converters and output an encoded signal based on one such digital signal that is received from an unclipped analog-to-digital converter having the highest analog-to-digital conversion resolution.

13. The resolution-enhancing analog-to-digital signal conversion circuit of claim 12, wherein the plurality of analog-to-digital converters each have a same number of measurement intervals.

14. The resolution-enhancing analog-to-digital signal conversion circuit of claim 12, wherein the high-level analog-todigital converter and the low-level analog-to-digital converter have a same size analog-to-digital conversion resolution.

15. The resolution-enhancing analog-to-digital signal conversion circuit of claim 12, wherein the plurality of analog-to-digital converters further includes at least:
   a higher-level analog-to-digital converter configured to convert an analog signal of a fourth voltage range, different than the first voltage range, the second voltage range, and the third voltage range, the fourth voltage range including a lower voltage limit that is equal to the high-end target voltage, the higher-level analog-to-digital converter having a higher analog-to-digital conversion resolution than the mid-level analog-to-digital converter;
   a lower-level analog-to-digital converter configured to convert an analog signal of a fifth voltage range different than the first voltage range, the second voltage range, the third voltage range, and the fourth voltage range, the fifth voltage range including an higher voltage limit that is equal to the low-end target voltage, the lower-end analog-to-digital converter having a higher analog-to-digital conversion resolution than the mid-level analog-to-digital converter; and
   wherein the second voltage range includes a higher voltage limit that is equal to the high-end target voltage and the third voltage range includes a lower voltage limit that is equal to the low-end target voltage.

16. The resolution-enhancing analog-to-digital signal conversion circuit of claim 12, wherein the input regulation module comprises a plurality of limiters, each limiter of the plurality of limiters being electrically coupled to a corresponding analog-to-digital converter and configured to clip the analog signal input to that analog-to-digital converter to an analog signal within the voltage range corresponding to that analog-to-digital converter if the analog signal otherwise is outside of the voltage range corresponding to that analog-to-digital converter.

17. The resolution-enhancing analog-to-digital signal conversion circuit of claim 12, wherein the encoded signal includes a floating point number indicating a voltage level of the digital signal that is received from the unclipped analog-to-digital converter having the highest analog-to-digital conversion resolution.

18. The resolution-enhancing analog-to-digital signal conversion circuit of claim 12, wherein the encoded signal includes an integer value and the controller is configured to output a second signal that includes a multiplier value that qualifies scaling of the integer value to correspond to a voltage level of the digital signal that is received from the unclipped analog-to-digital converter having the highest analog-to-digital conversion resolution.

19. A resolution-enhancing analog-to-digital signal conversion circuit, comprising:
   a plurality of analog-to-digital converters arranged in parallel, each analog-to-digital converter of the plurality of analog-to-digital converters being configured to output a digital signal that identifies an analog signal input to that analog-to-digital converter, the plurality of analog-to-digital converters including at least:
      a first analog-to-digital converter configured to convert an analog signal of a first voltage range, the first voltage rang including a target voltage, and
      a second analog-to-digital converter configured to convert an analog signal of a second voltage range, different than the first voltage range, including the target voltage;
   an input regulation module configured to clip the analog signal input to any of the plurality of analog-to-digital converters to an analog signal within the voltage range corresponding to that analog-to-digital converter if such an analog signal otherwise is outside of the voltage range corresponding to that analog-to-digital converter; and
   a controller configured to receive the digital signal output from each of the plurality of analog-to-digital converters and output an encoded signal based on one or more digital signals that are received from one or more unclipped analog-to-digital converters of the plurality of analog-to-digital converters.

20. The resolution-enhancing analog-to-digital signal conversion circuit of claim 12, wherein the first voltage range is bound by a first upper voltage limit and a first lower voltage limit and the second voltage range is bound by a second upper voltage limit and a second lower voltage limit, the first upper voltage limit being greater than the second upper voltage limit and the first lower voltage limit being greater than the second lower voltage limit; and wherein the encoded signal is based on an average of a plurality of digital signals received from more than one unclipped analog-to-digital converter of the plurality of analog-to-digital converters.

* * * * *

UNITED STATES PATENT AND TRADEMARK OFFICE
CERTIFICATE OF CORRECTION

PATENT NO.        : 8,217,822 B2  
APPLICATION NO.   : 12/942821  
DATED             : July 10, 2012  
INVENTOR(S)       : Andrew Lovitt Page 1 of 1

It is certified that error appears in the above-identified patent and that said Letters Patent is hereby corrected as shown below:

In the Claims

Column 16, line 17, In Claim 19, delete "rang" and insert -- range --, therefor.

Signed and Sealed this
Third Day of February, 2015

Michelle K. Lee
*Deputy Director of the United States Patent and Trademark Office*